(12) United States Patent
Pearson et al.

(10) Patent No.: US 7,026,961 B2
(45) Date of Patent: Apr. 11, 2006

(54) REAL TIME BINARY ARITHMETIC ENCODING

(75) Inventors: Eric Pearson, Conestogo (CA);
Michael D. Gallant, Kitchener (CA);
Harminder Banwait, Waterloo (CA)

(73) Assignee: LSI Logic Corporation, Milpitas, CA (US)

( * ) Notice: Subject to any disclaimer, the term of this patent is extended or adjusted under 35 U.S.C. 154(b) by 33 days.

(21) Appl. No.: 10/837,922

(22) Filed: May 3, 2004

(65) Prior Publication Data

US 2005/0258982 A1    Nov. 24, 2005

(51) Int. Cl.
*H03M 7/00*    (2006.01)
(52) U.S. Cl. .......................................... 341/50; 341/51
(58) Field of Classification Search ................... 341/50
See application file for complete search history.

(56) References Cited

U.S. PATENT DOCUMENTS

| | | | |
|---|---|---|---|
| 6,646,578 B1 * | 11/2003 | Au | 341/67 |
| 6,798,977 B1 * | 9/2004 | Maeda | 386/111 |
| 6,906,647 B1 * | 6/2005 | Bossen | 341/107 |

* cited by examiner

*Primary Examiner*—Peguy JeanPierre
*Assistant Examiner*—Joseph Lauture
(74) *Attorney, Agent, or Firm*—Christopher P. Maiorana, P.C.

(57) ABSTRACT

An apparatus comprising a first circuit and a second circuit. The first circuit may be configured to generate a plurality of signals in response to one or more of a context index and a binary symbol. The second circuit may be configured to generate a series of output bits in response to the plurality of signals. The memory may be configured to transfer the plurality of signals between the first circuit and the second circuit.

20 Claims, 4 Drawing Sheets

REAL TIME BINARY ARITHMETIC ENCODING

FIELD OF THE INVENTION

The present invention relates to data compression generally and, more particularly, to a method and/or apparatus for real time binary arithmetic encoding.

BACKGROUND OF THE INVENTION

A H.264 video encoder/decoder (CODEC) is configured, as part of the main profile, to perform context adaptive binary arithmetic coding (CABAC). During encoding, binary symbols (bins) are encoded using arithmetic coding to produce a series of bits. Video encoding is done in real time, with limits placed on the bit-rate and binary symbol rate separately. The encoding of each binary symbol takes a single arithmetic encoding cycle.

An arithmetic encoding cycle is complex and forms a bottleneck. During each arithmetic encoding cycle, 0 to 6 data bits can be produced. The data bits are either (i) output into a bit stream as a "0" or a "1" or (ii) delayed (i.e., by accumulating the date bits in a variable, e.g., bitsOutstanding). When the data bits are output into the bit stream, a data bit is output followed by the complement of the output bit bitsOutstanding number of times. The variable bitsOutstanding is subsequently cleared. Depending upon the data encoded, the amount of delayed data bits (i.e., the value of the variable bitsOutstanding) can grow without bound. For example, the H.264 recommendation limits the variable bitsOutstanding only by the size of the picture.

The lack of a limit other than the picture size causes wasted arithmetic encoding cycles. For example, as bits are encoded, yet not output, a point is reached where the bits must suddenly be output, taking time during which the arithmetic encoder is idle. When the variable bitsOutstanding (i.e., the number of delayed data bits) grows over multiple binary symbols, the output bit-rate is interrupted. Furthermore, while the variable bitsOutstanding is expanded into the output bit stream, the binary symbol rate is interrupted. Large delays are statistically rare. However, a series of small delays can significantly drop the efficiency of the arithmetic encoder.

A conventional solution, provided by the H.264 JM software reference model, performs the operations serially as a single thread. The conventional solution has a disadvantage of being inefficient to implement in hardware for real-time applications. When directly ported to hardware for real time video processing, the conventional solution can result in (i) idle cycles in the output bit-rate data path when the variable bitsOutstanding is accumulated and (ii) an idle cycle in the arithmetic encoder when the variable bitsOutstanding is expanded into the output data path. The effective binary symbol rate and bit-rate throughput of the conventional arithmetic encoder are limited. To gain back real time performance with the conventional solution, multiple arithmetic encoders must be employed. However, using multiple arithmetic encoders is practical only if the image is sliced, and each slice is processed independently. Although, slices can be used for H.264, quality and/or compression can be adversely affected.

Referring to FIG. 1, a block diagram of an arithmetic encoder 10 is shown. The arithmetic encoder 10 has an input that receives context index (CTX) and binary symbols (BIN) from a binary symbol/context calculation logic 12. The binary symbol/context calculation logic 12 generates the context index and binary symbols in response to a compressed video syntax stream. The arithmetic encoder 10 has an output that presents a series of bits to an output buffer 14. The output buffer 14 implemented as a dynamic random access memory (DRAM). The output buffer 14 generates a bit stream in response to the series of bits.

The arithmetic encoder 10 includes an arithmetic encoder/decoder (CODEC) 16 and an arithmetic output logic 18. The arithmetic encoder/decoder 16 generates a first signal (i.e., CODIRANGE) and a second signal (i.e., CODILOW) in response to the context index CTX and the binary symbols BIN received from the binary symbol/context calculation logic 12. The arithmetic output logic circuit 18 generates the series of bits (i.e., BITS) in response to the signals CODIRANGE and CODILOW.

It would be desirable to have a method and/or apparatus for sustained real time binary arithmetic coding.

SUMMARY OF THE INVENTION

The present invention concerns an apparatus comprising a first circuit, a second circuit and a memory. The first circuit may be configured to generate a plurality of signals in response to one or more of a context index and a binary symbol. The second circuit may be configured to generate a series of output bits in response to the plurality of signals. The memory may be configured to transfer the plurality of signals between the first circuit and the second circuit.

The objects, features and advantages of the present invention include providing a method and/or apparatus for real time binary arithmetic encoding that may (i) allow a compact hardware implementation of a real time main profile (CABAC) H.264 video encoder, (ii) eliminate artificial slicing of an image and the associated quality/compression loss, (iii) provide correct functionality even in the improbable situation of an overflow, (iv) maintain binary symbol to bit throughput under adverse compression scenarios, (v) reduce or eliminate idle time of an arithmetic encoder and/or (vi) reduce or eliminate idle time in an output data path.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
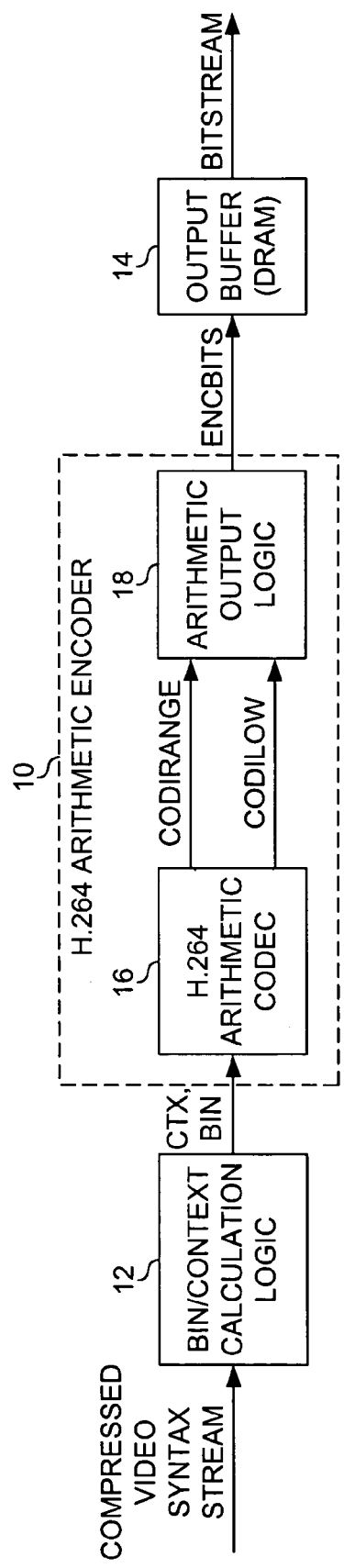
FIG. 1 is a block diagram illustrating a conventional arithmetic encoder.
Figure 2:
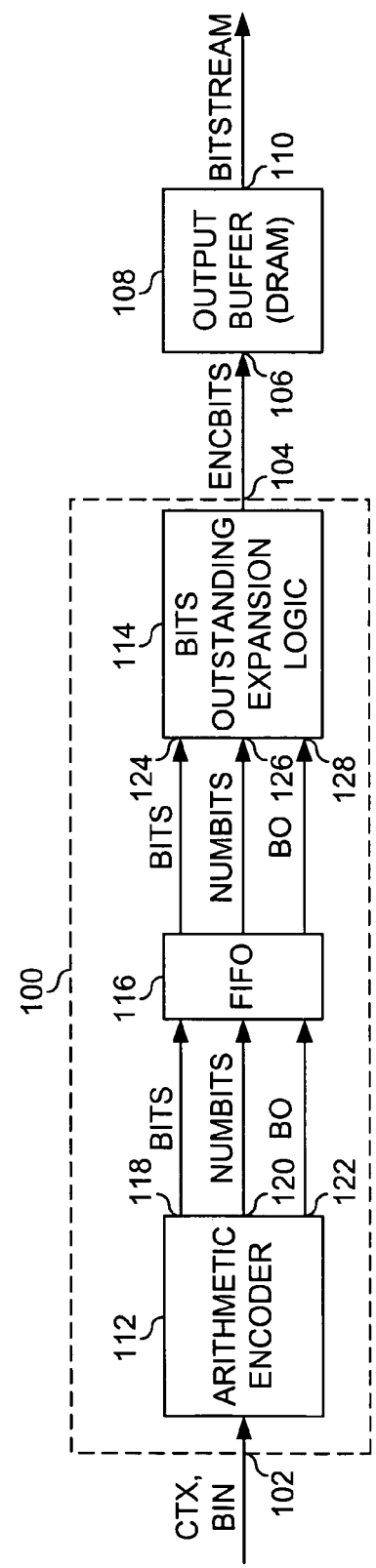
FIG. 2 is a block diagram illustrating a preferred embodiment of the present invention.

Referring to FIG. 2, a block diagram illustrating a circuit (or block) 100 implemented in accordance with a preferred embodiment of the present invention is shown. The circuit 100 may be implemented, in one example, as an encoder block. In one example, the circuit 100 may be implemented as an H.264 compliant arithmetic encoder. The circuit 100 generally has an input 102 configured to receive a context index (e.g., CTX) and binary symbols (e.g., BIN). In one example, the context index CTX and binary symbols BIN may be received from a binary symbol/context calculation logic implemented according to conventional techniques. In one example, the context index (or signal) CTX and the binary symbols (or signal) BIN may represent a compressed video syntax stream.

The circuit 100 may also have an output 104 that may present a signal (e.g., ENCBITS). The signal ENCBITS generally comprises a series of bits. The signal ENCBITS may comprise compressed and/or encoded data (e.g., video, audio, etc.). For example, the signal ENCBITS may comprise arithmetic encoded data including the bits outstanding (e.g., with expansion). The signal ENCBITS may be presented to an input 106 of an output buffer circuit 108. The output buffer circuit 108 may be implemented, in one example, as a dynamic random access memory (DRAM). The output buffer circuit 108 generally has an output 110 that may present a signal (e.g., BITSTREAM). The signal BITSTREAM generally comprises an encoded and/or compressed bit stream. In one example, the signal BITSTREAM may comprise an H.264 encoded bit stream.

The circuit 100 may comprise a circuit 112, a circuit 114 and a circuit 116. The circuit 112 may be implemented, in one example, as an arithmetic encoder circuit. The circuit 114 may be implemented, in one example, as an expansion logic block. The circuit 116 may be implemented, in one example, as a first-in first-out (FIFO) memory. In one example, the circuit 114 may be configured to expand a number of outstanding (or delayed) data bits into a series of output bits. The signals CTX and BIN may be presented to an input of the circuit 112.

The circuit 112 may have an output 118 that may present a signal (e.g., BITS), an output 120 that may present a signal (e.g., NUMBITS) and an output 122 that may present a signal (e.g., BO). The signal BITS may comprise one or more real bits output in the current cycle. For example, the signals BITS may comprise the arithmetic encoded data without the bits outstanding (e.g., no expansion of the bits outstanding). The signal NUMBITS generally comprises a value representing the number of real bits in the signal BITS. The signal BO generally comprises a count of outstanding (or delayed) bits from the previous arithmetic cycle. For example, the value of a bitsOutstanding variable may be communicated via the signal BO. The circuit 112 may be configured to generate the signals BITS, NUMBITS and BO in response to the signals CTX and BIN.

The circuit 114 may be implemented, in one example, as an expansion logic block. In one example, the block 114 may be configured to expand delayed data bits into an output bit stream. The block 114 may have an input 124 that may receive the signal BITS, an input 126 that may receive the signal NUMBITS and an input. 128 that may receive the signal BO. The circuit 114 is generally configured to generate the signal ENCBITS in response to the signals BITS, NUMBITS, and BO.

The circuit 116 is generally configured (i) to receive the signals BITS, NUMBITS and BO, (ii) to store the signals BITS, NUMBITS and BO (e.g., in a stack-like structure) and (iii) present the signals BITS, NUMBITS and BO. The circuit 116 is generally configured to decouple the process performed by the circuit 112 from the process performed by the circuit 114.

Figure 3:
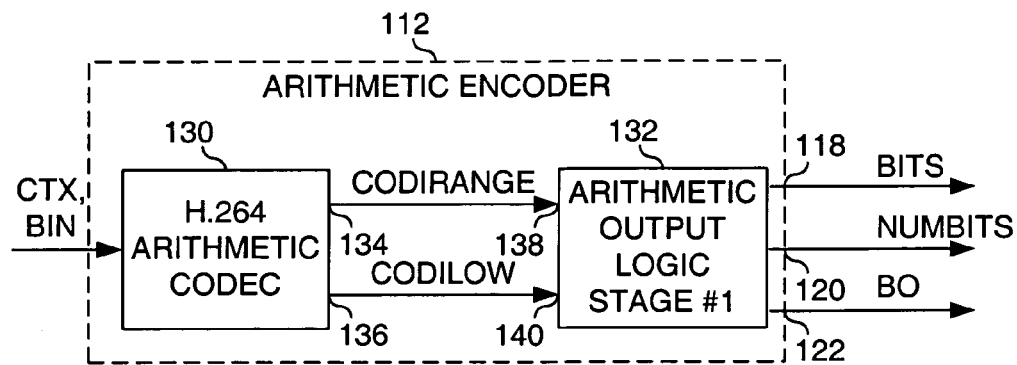
FIG. 3 is a more detailed block diagram illustrating an arithmetic encoder in accordance with a preferred embodiment of the present invention.

Referring to FIG. 3, a more detailed block diagram of the circuit 112 of FIG. 2 is shown. In one example, the circuit 112 may comprise a circuit (or block) 130 and a circuit (or block) 132. The circuit 130 may be implemented, in one example, as an arithmetic encoder/decoder (CODEC). In one example, the circuit 130 may be implemented as an H.264 compliant arithmetic encoder/decoder. In one example, the circuit 130 may be implemented using conventional techniques. The circuit 132 may be implemented, in one example, as an arithmetic output logic stage (or block). In one example, the circuit 132 may be a first stage of multiple stages.

The circuit 130 may have an output 134 that may present a signal (e.g., CODIRANGE) and an output 136 that may present a signal (e.g., CODILOW). The circuit 130 may be configured to generate the signals CODIRANGE and CODILOW in response to the signals CTX and BIN. The signals CODIRANGE and CODILOW generally represent a state of the circuit 130. In one example, the signal CODILOW may comprise a value pointing to a lower end of a sub-interval. In one example, the signal CODIRANGE may comprise a value specifying a corresponding range of sub-interval pointed to by the signal CODILOW.

The circuit 132 may have an input 138 that may receive the signal CODIRANGE and an input 140 the may receive the signal CODILOW. The circuit 132 may be configured to generate the signals BITS, NUMBITS and BO in response to the signals CODIRANGE and CODILOW.

Figure 4:
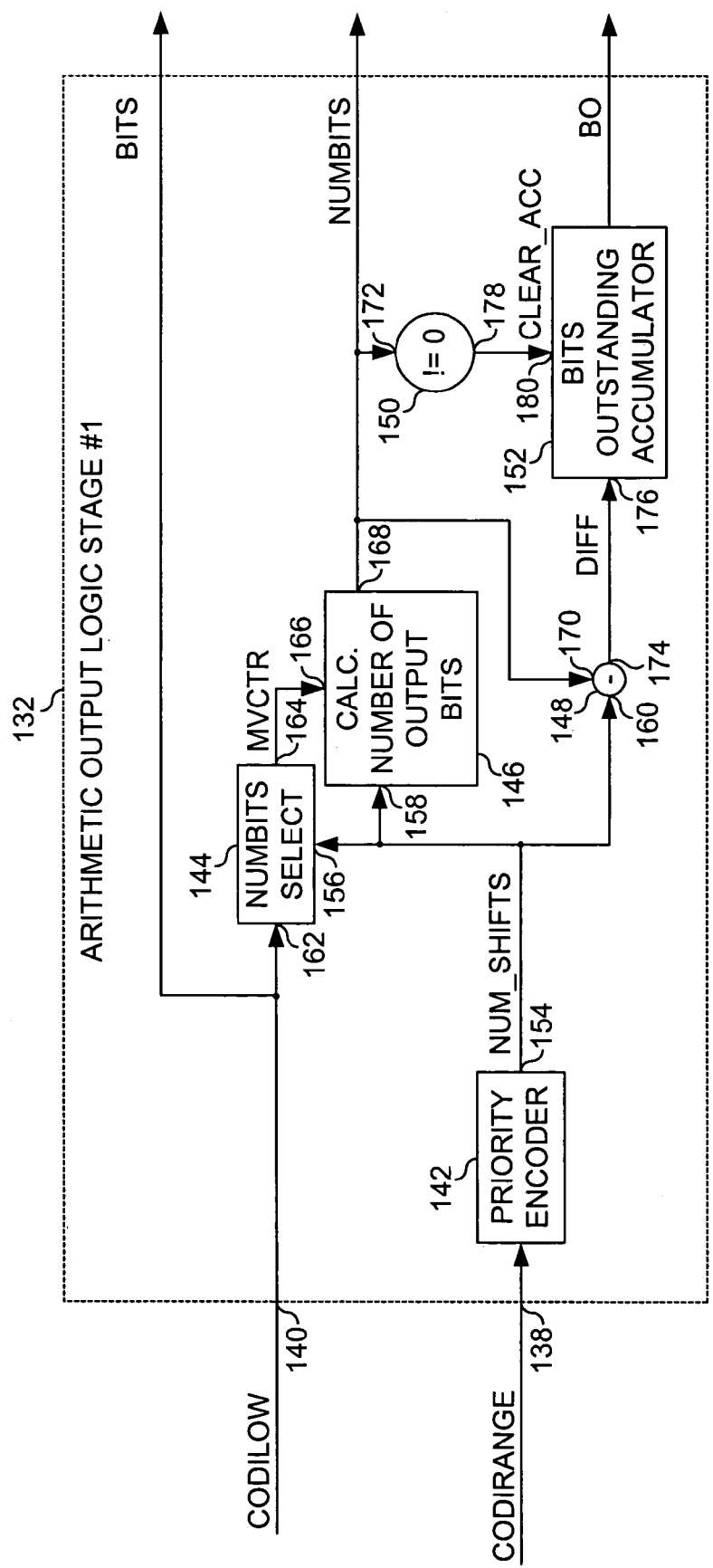
FIG. 4 is a more detailed block diagram illustrating an arithmetic output logic in accordance with a preferred embodiment of the present invention.

Referring to FIG. 4, a more detailed block diagram of the circuit 132 is shown illustrating an arithmetic output logic stage in accordance with a preferred embodiment of the present invention. The circuit 132 may comprise a circuit (or block) 142, a circuit (or block) 144, a circuit (or block) 146, a circuit (or block) 148, a circuit (or block) 150, and a circuit (or block) 152. The circuit 142 may be implemented, in one example, as a priority encoder. The circuit 144 may be implemented, in one example, as a number of bits selector. The circuit 146 may be implemented, in one example, as a block configured to calculate a number of bits for output. The circuit 148 may be implemented, in one example, as a difference circuit. The circuit 150 may be implemented, in one example, as a comparator circuit. The circuit 152 may be implemented, in one example, as an accumulator block.

The circuit 142 may have an input that may receive the signal CODIRANGE. The circuit 142 may have an output 154 that may present a signal (e.g., NUM_SHIFTS) to (i) an input 156 of the circuit 144, (ii) an input 158 of the circuit 146 and (iii) an input 160 of the circuit 148. The circuit 142 may be configured to generate the signal NUM_SHIFTS in response to the signal CODIRANGE.

The signal CODILOW may be presented to an input 162 of the circuit 144. The signal CODILOW may be presented by the circuit 132, in one example, as the signal BITS. The circuit 144 may have an output 164 that may present a signal (e.g., MVCTR) to an input 166 of the circuit 146. The circuit 144 may be configured to generate the signal MVCTR in response to the signals CODILOW and NUM_SHIFTS. The signal MVCTR may comprise a masked vector that may be used to calculate the value of the signal NUMBITS The block 146 may have an output 168 that may present the signal NUMBITS. The signal NUMBITS may be presented to an input 170 of the circuit 148 and an input 172 of the circuit 150. The block 146 may be configured to generate the signal NUMBITS in response to the signal NUM_SHIFTS and the signal MVCTR.

The block 148 may have an output 174 that may present a signal (e.g., DIFF) to an input 176 of the circuit 152. The circuit 148 may be configured to present a difference between the signals NUMBITS and NUM_SHIFTS to the block 152. For example, the circuit 148 may be configured to generate the signal DIFF according to the following equation:

DIFF=NUM_HIFTS-NUMBITS.

The block 150 may have an output 178 that may present a signal (e.g., CLEAR_ACC) to an input 180 of the block 152. The block 150 may be configured to generate the signal CLEAR_ACC in response to the signal NUMBITS having a nonzero value. The block 152 may be configured to clear (or reset) an accumulated value in response to the signal CLEAR_ACC. The block 152 may be configured to generate the signal BO in response to the signal DIFF and the signal CLEAR_ACC.

Figure 5:
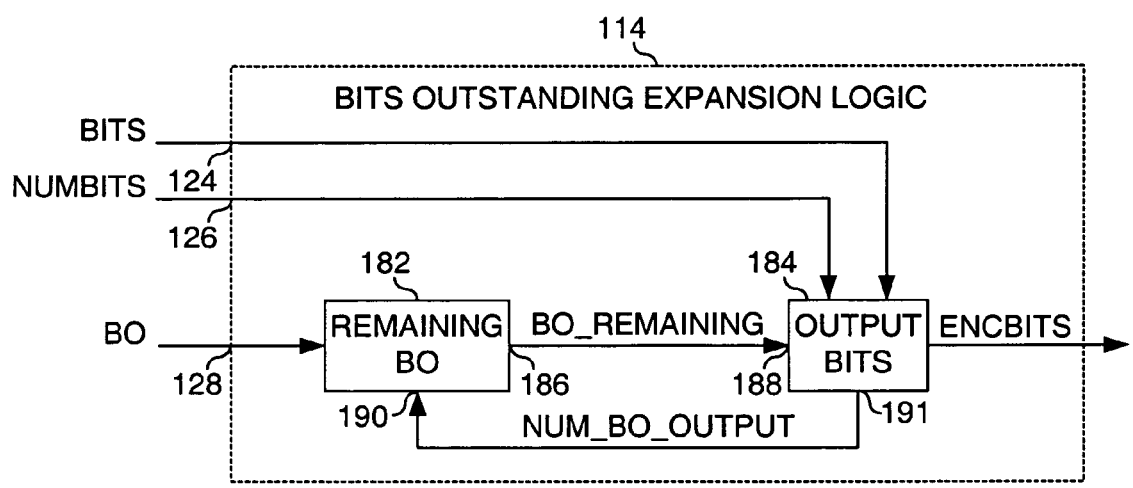
FIG. 5 is a more detailed block diagram illustrating an expansion logic in accordance with a preferred embodiment of the present invention.

Referring to FIG. 5, a more detailed block diagram of the circuit 114 of FIG. 2 is shown. The circuit 114 may comprise a circuit (or block) 182 and a circuit (or block) 184. The block 182 may be configured to receive the signal BO from the input 128. The block 182 may have an output 186 that may present a signal (e.g., BO_REMAINING) to an input 188 of the block 184 and an input 190 that may receive a signal (e.g., NUM_BO_OUTPUT) from an output 191 of the circuit 184. The circuit 182 may be configured to determine a number of remaining bits outstanding to be output based on a comparison between the signal BO and the signal NUM_BO_OUTPUT. The number of remaining bits outstanding to be output may be presented in the signal BO_REMAINING.

The block 184 may be further configured to receive the signals BITS and NUMBITS from the inputs 124 and 126, respectively. The circuit 184 may be configured to generate the signals NUM_BO_OUTPUT and ENCBITS in response to the signals BITS, NUMBITS and BO_REMAINING.

Figure 6:
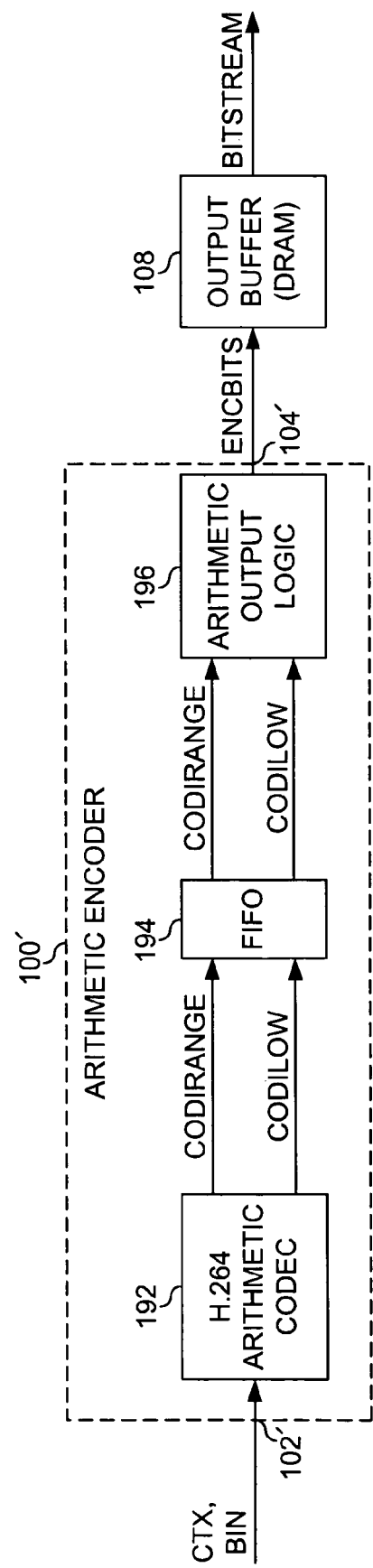
FIG. 6 is a block diagram illustrating an alternative embodiment of the present invention.

Referring to FIG. 6 a block diagram of an arithmetic encoder 100' is shown illustrating an alternative embodiment of the present invention. The circuit 100' generally has (i) an input 102' configured to receive the context index CTX and the binary symbols BIN and (ii) an output 104' configured to present the signal ENCBITS. The circuit 100' may comprise a circuit 192, a circuit 194 and a circuit 196. The circuit 192 may be implemented, in one example, as an arithmetic encoder/decoder (CODEC). In one example, the circuit 192 may be implemented as a conventional arithmetic encoder/decoder. The circuit 192 generally has an input that may receive the signals CTX and BIN, a first output that may present the signal CODIRANGE and a second output that may present the signal CODILOW. The circuit 192 is generally configured to generate to signals CODIRANGE and CODILOW in response to the signals CTX and BIN.

The circuit 194 may be implemented in one example as a first in/first out (FIFO) memory. The circuit 194 may have a first input that may receive the signal CODIRANGE, a second input that may receive the signal CODILOW, a first output that may present the signal CODIRANGE and a second output that may present the signal CODILOW. The circuit 194 may be configured to receive and present the signals CODIRANGE and CODILOW at different rates.

The circuit 196 may be implemented, in one example, as an arithmetic output logic circuit. In one example, the circuit 196 may be implemented using a conventional arithmetic output logic block. The circuit 196 generally has a first input that may receive the signal CODIRANGE from the circuit 194 and a second input that may receive the signal CODILOW from the circuit 194. The circuit 196 is generally configured to generate the signal ENCBITS in response to the signals CODIRANGE and CODILOW.

The present invention generally provides a method and an apparatus for sustained real time binary arithmetic coding. The present invention may provide a method for building a robust real time H.264 video encoder. The need to (i) satisfy real time performance and (ii) be able to encode any stream correctly generally form contradictory engineering requirements. The present invention may provide a satisfactory-solution that facilitates building hardware to maintain real-time performance (and keep the arithmetic encoder fully utilized) for the frequent small delays and maintaining correctness in all cases.

Because the probability of the variable bitsOutstanding growing past a predetermined limit is less than $(0.5)^{\wedge}$limit, a system may be designed to keep the arithmetic encoder fully utilized. The arithmetic encoder may be kept utilized by separating the arithmetic encoding process from the bitsOutstanding expansion process. For example, a first-in first-out, (FIFO) memory may be implemented to couple the two processes. The FIFO memory may be configured to absorb arithmetic encoder output while the bitsOutstanding expansion is performed. An output buffer (e.g., a deep FIFO) is generally implemented to link the expanded bit stream to a real-time bit-rate limited communications channel.

The present invention may, in one embodiment, change the output from the arithmetic encoder from a single bit, as in the conventional solution, to a set of variables (e.g., NUMBITS[2:0], BITS[5:0], BITSOUTSTANDING (BO) [23:0]). The variable NUMBITS[2:0] generally comprises the number of real bits output in a current cycle contained in the variable (or signal) BITS[5:0]. The variable BITSOUTSTANDING (BO) [23:0] generally comprises the count (e.g., bitsOutstanding) from the previous arithmetic cycle. When the variable NUMBITS is greater than 0, all three variables are generally pushed onto the top of a stack implemented with the FIFO 116. The variable BITSOUTSTANDING (or BO) may be loaded with the count of remaining bitsOustanding from the cycle, if any.

The expansion unit 114 may be configured to expand the sequence to be the first bit from the variable BITS (e.g., BITS[NUMBITS-1]) followed by the complement of that bit repeated bitsOustanding times, followed by the remaining bits of the variable BITS (e.g., BITS[NUMBITS-2:0]), if any. In one example, an expansion operation may be summarized in the following TABLE 1:

TABLE 1

| VARIABLE | CONTENTS (or value) |
|---|---|
| BITS [5:0] | 010110 |
| NUMBITS [2:0] | 6 |
| BITSOUTSTANDING [23:0] | 10 |
| OUTPUT SERIES OF BITS | 0 1111111111 10110 |

The output series of bits generated by the example expansion operation shown in TABLE 1 generally starts with the first bit of the variable BITS[5:0] (e.g., "0"). The first bit is followed by a number of bits (i) determined by the value of the variable BITSOUTSTANDING[23:0] (e.g., ten) and (ii) set to the complement of the first bit (e.g., "1"). The ten bits are followed by the remaining bits of the variable BITS[5:0].

The value in the variable NUMBITS[2:0] generally indicates the number of valid (or real) bits in the variable BITS[5:0] (e.g., six in this example).

Another example expansion operation may be summarized in the following TABLE 2:

TABLE 2

| VARIABLE | CONTENTS (or value) |
|---|---|
| BITS [5:0] | 110 |
| NUMBITS [2:0] | 3 |
| BITSOUTSTANDING [23:0] | 5 |
| OUTPUT SERIES OF BITS | 1 00000 10 |

The output series of bits generated by the example expansion operation shown in TABLE 2 generally starts with the first bit of the variable BITS[5:0] (e.g., "1"). The first bit is followed by a number of bits (i) determined by the value of the variable BITSOUTSTANDING[23:0] (e.g., 5) and (ii) set to the complement of the first bit (e.g., "0"). The five complement bits are followed by the remaining bits of the variable BITS [5:0]. The value in the variable NUMBITS [2:0] generally indicates the number of valid (or real) bits in the variable BITS[5:0] (e.g., three in this example).

When the FIFO memory 116 is implemented with a depth D and the expansion logic 114 is configured to output, for example, 8 bits/cycle, the probability that there will be enough bits outstanding to overflow the queue is less than $(0.5)^{\wedge}(8*D)$. For example, when a queue depth of 8 is selected, the probability of an overflow is less than $(0.5)^{\wedge}64$ (or $5.421 \times 10^{\wedge}-20$). In general, a depth of 8 is reasonable given that processing at a binary symbol rate of $1 \times 10^{\wedge}8$ binary symbols/second translates to less than $2^{\wedge}52$ binary symbols/year being processed.

The advantages of the present invention may include facilitating a compact hardware implementation of a real time main profile (CABAC) H.264 video encoder; providing a solution that does not require artificial slicing of the image and the associated quality/compression loss; providing a correct functionality even in the improbable situation of an overflow; and/or maintaining bin-to-bit throughput even under adverse compression scenarios.

The present invention may be implemented using a conventional general purpose digital computer (or processor) programmed according to the teachings of the present specification, as will be apparent to those skilled in the relevant art(s). Appropriate software coding can readily be prepared by skilled programmers based on the teachings of the present disclosure, as will also be apparent to those skilled in the relevant art(s).

The present invention may also be implemented by the preparation of ASICs, FPGAs, or by interconnecting an appropriate network of conventional component circuits, as is described herein, modifications of which will be readily apparent to those skilled in the art(s).

The present invention thus may also include a computer product which may be a storage medium including instructions which can be used to program a computer to perform a process in accordance with the present invention. The storage medium can include, but is not limited to, any type of disk including floppy disk, optical disk, CD-ROM, and magneto-optical disks, ROMs, RAMs, EPROMs, EEPROMs, Flash memory, magnetic or optical cards, or any type of media suitable for storing electronic instructions.

While the invention has been particularly shown and described with reference to the preferred embodiments thereof, it will be understood by those skilled in the art that various changes in form and details may be made without departing from the spirit and scope of the invention.

The invention claimed is:

1. An apparatus comprising:
    a first circuit configured to generate a plurality of signals in response to one or more of a context index and a binary symbol, wherein said plurality of signals comprise (i) a first signal comprising one or more real bits output in a current encoding cycle, (ii) a second signal comprising a value representing a quantity of said one or more real bits in said first signal and (iii) a third signal comprising a value representing a count of outstanding bits from a previous encoding cycle;
    a second circuit configured to generate a series of output bits in response to said first, said second and said third signals; and
    a memory configured to transfer said first, said second and said third signals from said first circuit to said second circuit.

2. The apparatus according to claim 1, wherein said first circuit comprises an arithmetic encoder.

3. The apparatus according to claim 1, wherein said first circuit comprises an arithmetic encoder/decoder (CODEC).

4. The apparatus according to claim 1, wherein said plurality of signals represent a state of said first circuit.

5. The apparatus according to claim 1, wherein said plurality of signals further comprise a fourth signal comprising a value pointing to a sub-interval and a fifth signal comprising a value specifying a range of said sub-interval.

6. The apparatus according to claim 1, wherein said first circuit comprises:
    an arithmetic encoder configured to generate (i) a fourth signal comprising a value pointing to a sub-interval and (ii) a fifth signal comprising a value specifying a range of said sub-interval in response to said one or more of said context index and said binary symbol; and
    a logic circuit configured to generate said first signal, said second signal and said third signal in response to said fourth signal and said fifth signal.

7. The apparatus according to claim 6, wherein said logic circuit comprises:
    a priority encoder configured to generate a first intermediate signal in response to said fifth signal; and
    an accumulator configured to generate said third signal in response to said second signal and said first intermediate signal.

8. The apparatus according to claim 7, further comprising:
    a selector circuit configured to generate a second intermediate signal in response to said fourth signal and said first intermediate signal;
    a calculation circuit configured to generate said second signal in response to said first intermediate signal and said second intermediate signal; and
    a difference circuit configured to generate a third intermediate signal in response to said first intermediate signal and said second signal.

9. The apparatus according to claim 6, further comprising a first-in first-out (FIFO) memory configured to couple said arithmetic encoder to said logic circuit.

10. The apparatus according to claim 6, wherein said second circuit comprises:
    a first logic block configured to generate a fourth signal comprising a value representing a number of outstanding bits remaining in response to (i) said third signal and (ii) a fifth signal comprising a value representing a number of outstanding bits output in said series of output bits; and a second logic block configured to generate (i) said series of output bits and (ii) said fifth signal in response to (i) said first signal, said second signal and said fourth signal.

11. An apparatus comprising:

means for generating a plurality of signals in response to one or more of a context index and a binary symbol, wherein said plurality of signals comprise (i) a first signal comprising one or more real bits output in a current encoding cycle, (ii) a second signal comprising a value representing a quantity of said one or more real bits in said first signal and (iii) a third signal comprising a value representing a count of outstanding bits from a previous encoding cycle;

means for generating a series of output bits in response to said first, said second and said third signals; and means for storing said first, said second and said third signals for transfer from said means for generating said plurality of signals to said means for generating said series of output bits.

12. A method for real time arithmetic encoding comprising the steps of:

generating a plurality of signals in response to one or more of a context index and a binary symbol, wherein said plurality of signals comprise (i) a first signal comprising one or more real bits output in a current encoding cycle, (ii) a second signal comprising a value representing a quantity of said one or more real bits in said first signal and (iii) a third signal comprising a value representing a count of outstanding bits from a previous encoding cycle;

generating a series of output bits in response to said first, said second and said third signals; and storing said first, said second and said third signals prior to generating said series of output bits.

13. The method according to claim 12, further comprising the step of:

generating said one or more of said context index and said binary symbol in response to a video syntax stream.

14. The method according to claim 13, wherein said series of output bits comprises an H.264 compliant bit stream.

15. The method according to claim 12, further comprising the step of:

configuring said plurality of signals to represent a state of an arithmetic encoder.

16. The method according to claim 12, wherein the step of generating the plurality of signals comprises:

generating a fourth signal comprising a value pointing to a sub-interval; and generating a fifth signal comprising a value specifying a range of said sub-interval.

17. The method according to claim 16, wherein the step of generating the plurality of signals further comprises:

generating said first signal, said second signal and said third signal in response to said fourth signal and said fifth signal.

18. The method according to claim 17, wherein the step of generating the plurality of signals further comprises:

generating an intermediate signal according to a predetermined priority encoding scheme in response to said fifth signal; and generating said third signal in response to said second signal and said intermediate signal.

19. The method according to claim 12, wherein the step of generating said series of output bits comprises:

generating a fourth signal comprising a value representing a number of outstanding bits remaining in response to (i) said third signal and (ii) a fifth signal comprising a value representing a number of outstanding bits output in said series of output bits; and generating (i) said series of output bits and (ii) said fifth signal in response to (i) said first signal, said second signal and said fourth signal.

20. The method according to claim 12, further comprising the step of:

linking the series of output bits to a real-time bit-rate limited communications channel.

* * * * *